United States Patent [19]
Murzin et al.

[11] Patent Number: 6,055,928
[45] Date of Patent: May 2, 2000

[54] PLASMA IMMERSION ION PROCESSOR FOR FABRICATING SEMICONDUCTOR INTEGRATED CIRCUITS

[75] Inventors: Ivan Herman Murzin, Garland; Yanwei Zhang, Plano, both of Tex.

[73] Assignee: Ball Semiconductor, Inc., Allen, Tex.

[21] Appl. No.: 09/032,965

[22] Filed: Mar. 2, 1998

[51] Int. Cl.[7] .................................................. C23C 16/00
[52] U.S. Cl. ............................... 118/723 E; 118/723 AN; 156/345; 156/89; 427/38
[58] Field of Search .............................. 392/418; 427/38; 156/345, 89; 204/202, 192.12; 118/723 AN

[56] References Cited

U.S. PATENT DOCUMENTS

| | | | |
|---|---|---|---|
| 4,272,351 | 6/1981 | Kotani et al. | 204/202 |
| 4,582,720 | 4/1986 | Yamazaki | 427/38 |
| 4,652,318 | 3/1987 | Masuda et al. | 156/89 |
| 5,178,739 | 1/1993 | Barnes et al. | 204/192.12 |
| 5,571,366 | 11/1996 | Ishii et al. | 156/345 |
| 5,592,581 | 1/1997 | Okase | 392/418 |
| 5,904,780 | 5/1999 | Tomoyasu | 118/723 AN |

OTHER PUBLICATIONS

U.S. Serial No. 08/858,044, filed on May 16, 1997, entitled Spherical Shaped Semiconductor Integrated Circuit, Akira Ishikawa, Abstract and 15 sheets of drawings.

U.S. Serial No. 08/996,260, filed on Dec. 22, 1997, entitled Apparatus and Method For Fabricating Spherical Shaped Semiconductor Integrated Circuits, Ohkusa et al., Abstract and 1 sheet of drawings.

X.Y. Qian et al., Plasma Immersion Ion Implantation of $SeF_4$ and $BF_3$ for sub–100 nm $P_+IN$ Junction Fabrication, Appl. Phys. Lett. 59(3), Jul. 15, 1991, at 348.

Meng–Hsiung Kiang et al., PD/Si *Plasma Immersion Ion Implantation for Selective Electroless Copper Plating on $SiO_2$*, Appl Phys. Lett. 60 (22), Jun. 1, 1992, at 2767.

Andre Anders et al., Metal Plasma Immersion Ion Implantation and Deposition Using Vacuum Arc Plasma Sources, J. Vac. Sci. Technol. B, Mar./Apr. 1994, at 815.

Paul K. Chu et al., Recent Applications of Plasma Immersion Ion Implantation, Semiconductor International, Jun. 1996, at 165.

Donald J. Rej, Plasma Immersion Ion Implantation (PIII), Handbook of Thin Film Process Technology, 1996, at E2.3:1.

R.J. Matyi et al, Materials Properties of B–Doped Si by Low Energy Plasma Source Ion Implantation, 1997, at 749.

S.B. Felch et al., Formation of Deep Sub–Micron Buried Channel pMOSFETs with Plasma Doping.

C.M. Osburn, Ultra–Shallow Junction Formation Using Very Low Engery B and $BF_2$ Sources, at 607.

*Primary Examiner*—Thi Dang
*Assistant Examiner*—Rudy Zervigon
*Attorney, Agent, or Firm*—Haynes & Boone, L.L.P.

[57] ABSTRACT

An apparatus and method for fabricating a spherical shaped semiconductor integrated circuit according to which a chamber is provided into which spheres of a semiconductor material are introduced therein. Process gases are also selectively introduced into the chamber. The chamber includes a metallic portion that is selectively provided a voltage. Upon receiving the voltage, the chamber attracts ions from the process gases, at least some of the attracted ions treating the spheres according to a particular aspect of the fabrication process.

20 Claims, 2 Drawing Sheets

PLASMA IMMERSION ION PROCESSOR FOR FABRICATING SEMICONDUCTOR INTEGRATED CIRCUITS

BACKGROUND OF THE INVENTION

The invention relates generally to semiconductor integrated circuits, and more particularly, to an apparatus and method for fabricating a spherical-shaped semiconductor integrated circuit.

Conventional integrated circuits, or "chips," are formed from a flat surface semiconductor wafer. The semiconductor wafer is first manufactured in a semiconductor material manufacturing facility and is then provided to a fabrication facility. At the latter facility, several layers are processed onto the semiconductor wafer surface. Once completed, the wafer is then cut into one or more chips and assembled into packages. Although the processed chip includes several layers fabricated thereon, the chip still remains relatively flat.

A fabrication facility is relatively expensive due to the enormous effort and expense required for creating flat silicon wafers and chips. For example, manufacturing the wafers requires several high-precision steps including creating rod-form polycrystalline semiconductor material; precisely cutting ingots from the semiconductor rods; cleaning and drying the cut ingots; manufacturing a large single crystal from the ingots by melting them in a quartz crucible; grinding, etching, and cleaning the surface of the crystal; cutting, lapping and polishing wafers from the crystal; and heat processing the wafers. Moreover, the wafers produced by the above processes typically have many defects which are largely attributable to the difficulty in making a single, highly pure crystal due to the above cutting, grinding and cleaning processes as well as due to the impurities, including oxygen, associated with containers used in forming the crystals. These defects become more and more prevalent as the integrated circuits formed on these wafers become smaller.

Another major problem associated with modern fabrication facilities for flat chips is that they require extensive and expensive equipment. For example, dust-free clean rooms and temperature-controlled manufacturing and storage areas are necessary to prevent the wafers and chips from defecting and warping. Also, these types of fabrication facilities suffer from a relatively inefficient throughput as well as an inefficient use of the silicon. For example, facilities using in-batch manufacturing, where the wafers are processed by lots, must maintain huge inventories to efficiently utilize all the equipment of the facility. Also, because the wafers are round, and the completed chips are rectangular, the peripheral portion of each wafer cannot be used.

Still another problem associated with modern fabrication facilities is that they do not produce chips that are ready to use. Instead, there are many additional steps that must be completed, including cutting and separating the chip from the wafer; assembling the chip to a lead frame which includes wire bonding, plastic or ceramic molding and cutting and forming the leads, positioning the assembled chip onto a printed circuit board; and mounting the assembled chip to the printed circuit board. The cutting and assembly steps introduce many errors and defects due to the precise requirements of such operations. In addition, the positioning and mounting steps are naturally two-dimensional in character, and therefore do not support curved or three dimensional areas.

Therefore, due to these and various other problems, only a few companies in the world today can successfully manufacture conventional flat chips. Furthermore, the chips must bear a high price to cover the costs of manufacturing, as well as the return on initial capital and investment.

In U.S. Pat. No. 5,955,776 filed on May 16, 1997, assigned to the same assignee as the present application and hereby incorporated by reference, a method and apparatus for manufacturing spherical-shaped semiconductor integrated circuits is disclosed. The present invention is specific to an apparatus and method for performing fabrication steps on the circuits.

SUMMARY OF THE INVENTION

The present invention, accordingly, provides an apparatus and method for fabricating a spherical shaped semiconductor integrated circuit according to which a chamber is provided into which spheres of a semiconductor material are introduced therein. Process gases are also selectively introduced into the chamber. The chamber includes a metallic portion that is selectively provided a voltage. Upon receiving the voltage, the chamber attracts ions from the process gases, at least some of the attracted ions treating the spheres according to a particular aspect of the fabrication process.

In one embodiment, the metallic portion of the chamber forms a mesh-type area to allow the ions to flow therethrough. In another embodiment, the metallic portion of the chamber is a conveyor tray for holding at least one of the spheres.

Several advantages result from the foregoing. For example the process gases can treat the spheres in several manners including depositing a thin film on the spheres, etching the spheres. Also, the spheres can be continuously introduced into the chamber to reduce or eliminate the need for a clean room environment. Also, the chamber can be maintained at a relatively high temperature above conventional semiconductor material warping or melting points. Further, the spherical shape of the circuit provides much greater surface area on which the process gas acts, when compared to the surface area of a conventional flat semiconductor. Still further, the method of the present invention can be carried out in a relatively small space and eliminates the requirements for assembly and packaging facilities.

DESCRIPTION OF THE PREFERRED EMBODIMENT

Figure 1:
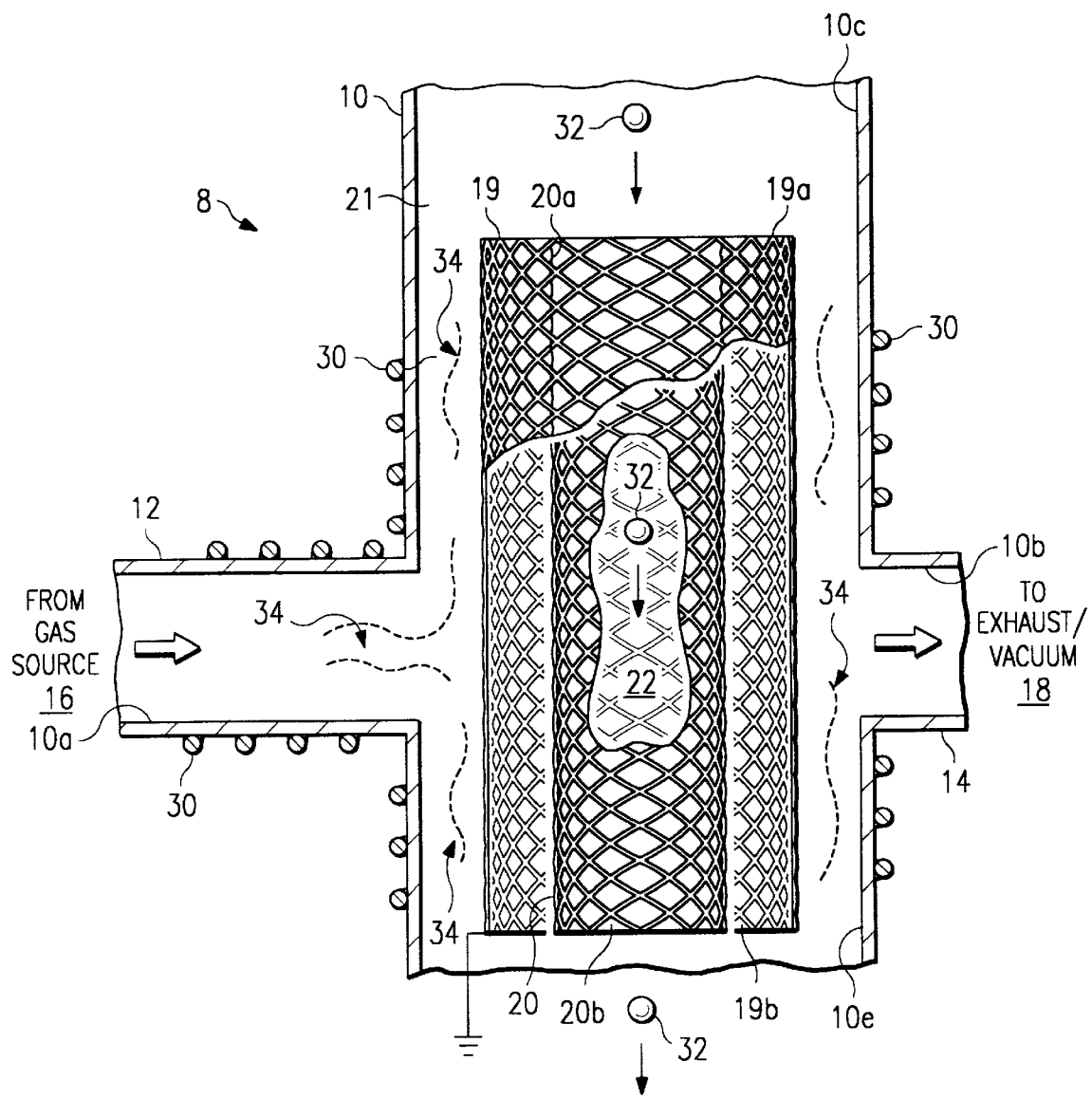
FIG. 1 illustrates a plasma processor according to one embodiment of the invention.

Referring to FIG. 1, the reference numeral 8 refers, in general, to one embodiment of a plasma processor for selectively performing several different plasma processes such as ion implantation, deposition and ion (dry) etching. Moreover, multiple processes such as simultaneous and consecutive implantation, deposition and etching, are possible by varying parameters described herein.

The processor 8 includes an enclosure 10 in the form of a hollow tube having an inlet opening 10a and an outlet opening 10b located diametrically opposite the inlet opening 10a. One end of a horizontally extending inlet conduit 12 registers with the inlet opening 10a for providing gases and/or other process constituents to the tube 10 from a source 16. The source 16 may be a cathodic arc, a direct current (DC) magnetron, a combination of DC magnetron with an RF coil ionizer, or other ion source. One end of a horizontally extending outlet conduit 14 registers with the outlet opening 10b for providing a negative pressure inside the tube 10 and exhausting gases and/or other process constituents to a vacuum/exhaust facility 18. It is understood that the conduits 12, 14 and tube 10 are connected in any known manner and, alternately, can be integrally formed.

Two hollow inner tubes 19, 20 extend within the tube 10 in a coaxial, slightly spaced relationship. A substantially cylindrical passage 21 is defined between the inner tube 19 and the tube 10. The inner tubes 19, 20 have inlet openings 19a, 20a, respectively and outlet openings 19b, 20b, respectively. The interior of the inner tubes 19, 20 define a central chamber 22 between the outlet openings 19b, 20b and the diametrically opposite inlet openings 19a, 20a.

An electrical conductor 30 is coiled around the outer surface of the conduit 12 and enclosure 10 for creating a radio frequency current in connection with a plasma process that may be performed in connection with the chamber 22 as described below.

In operation, a plurality of members 32, each of a semiconductor material, are introduced through the inlet openings 19a, 20a and pass into the chamber 22 in the inner tube 20. Normally, the members 32 will be spinning due to rotating momentum. The members 32 are preferably of a generally spherical shape and could be of the same type formed according to the technique disclosed in the above-identified and presently incorporated U.S. Pat. No. 5,955,776. After traversing the interior of the chamber 22, the members 32 pass through the outlet openings 19b, 20b in the inner tubes 19, 20. The introduction and discharge of the members 32 in this manner is controlled to prevent the accumulation of a relatively large number of members in the chamber 22 at the same time.

During this flow of the members 32 through the chamber 22, the source 16 selectively introduces one or more gases into the inlet conduit 12, directed towards the chamber 22. The particular gases that are introduced into the chamber 22, or the constituents in the gas, depends on the specific desired treatment of the members 32. As an example, a gas, such as $BF_3$ or oxygen, that is capable of being converted to a plasma in a manner to be described, is introduced into the conduit 12 and passes towards the chamber 22 in a direction that extends approximately ninety degrees to the direction of the passage of the members 32 through the chamber. A source of other ionized materials such as metals can provide the ions in the direction of the chamber 22 in a similar manner. The gases establish a region 34, shown as phantom lines in the drawing, surrounding the inner tubes 19, 20. The distance between the source of the gas 16 and the region 34 is comparable to or less than the mean free path of the plasma species. Further, the vacuum/exhaust 18 maintains a pressure inside the tube 10 at about 0.1 to 1 Torr during discharge of the gas.

During the passage of the gas through the conduit 12 and tube 10, the coil 30 is activated and the gas, in combination with RF current from the coil and the resulting magnetic fields, becomes an inductively coupled plasma (hereinafter referred to as a "plasma"). The magnetic field produced by the RF coil 30 also serves to spread and maintain the plasma throughout the entire region 34.

Figure 2:
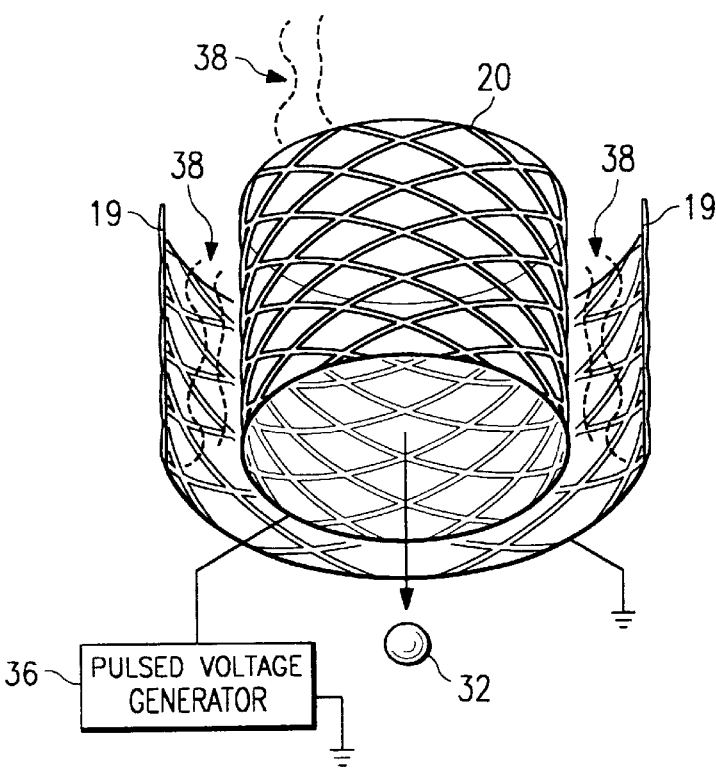
FIG. 2 provides additional detail of an inner tube forming a chamber in the plasma processor of FIG. 1.

Referring also to FIG. 2, the inner tubes 19, 20 behave as perforated electrodes. In one embodiment, the perforated electrodes 19, 20 are made of a mesh-type material with a high ratio of open-area to material. In the preferred embodiment, the material is coated with silicon, as is used in the members 32. It is understood that many different types of material may be used, with different shaped openings and/or different coatings.

A pulsed voltage generator 36 is used to apply voltage pulses on the perforated electrode 20 for a duration of about 1–10 millisecond. The perforated electrode 19 is tied to a ground voltage. The negative voltage between the two electrodes 19, 20 can vary from 0.1V to 100 kV, depending on the process to be carried out (ion implantation, etching, or deposition). When the voltage differential is applied to the perforated electrodes 19, 20, it forms a sheath region 38. While the perforated electrode 20 is being pulsed, ions in the plasma in the region 34 are attracted to the sheath region 38 and accelerate towards the perforated electrode. The ions maintain a high velocity and pass through the holes in the perforated electrodes 19, 20, towards the member 32. Because the perforated electrodes 19, 20 are coated with silicon, when some of the ions bombard the electrode, silicon is sputtered, which does not harm the silicon sphere member 32.

The ions from the plasma therefore pass over the members 32 in the chamber and come into intimate contact with the members. The entire surface of the member 32 is uniformly implanted due to the cylindrical geometry of the perforated electrodes 19, 20. The pulsed voltage generator 36 can thereby process a continuous series of members falling one after another. Also, due to the negative pressure provided by the exhaust/vacuum 18, the ions from the chamber 22, as well as some of the plasma in the cylindrical passage 21, exit the tube 10 through the outlet opening 10b, and pass into the conduit 14 for discharge.

After, the members 32 have been processed in the foregoing manner, they may be re-introduced into the processor 8 for additional processing. The additional processing may be the same or different fabrication operation.

Figure 3:
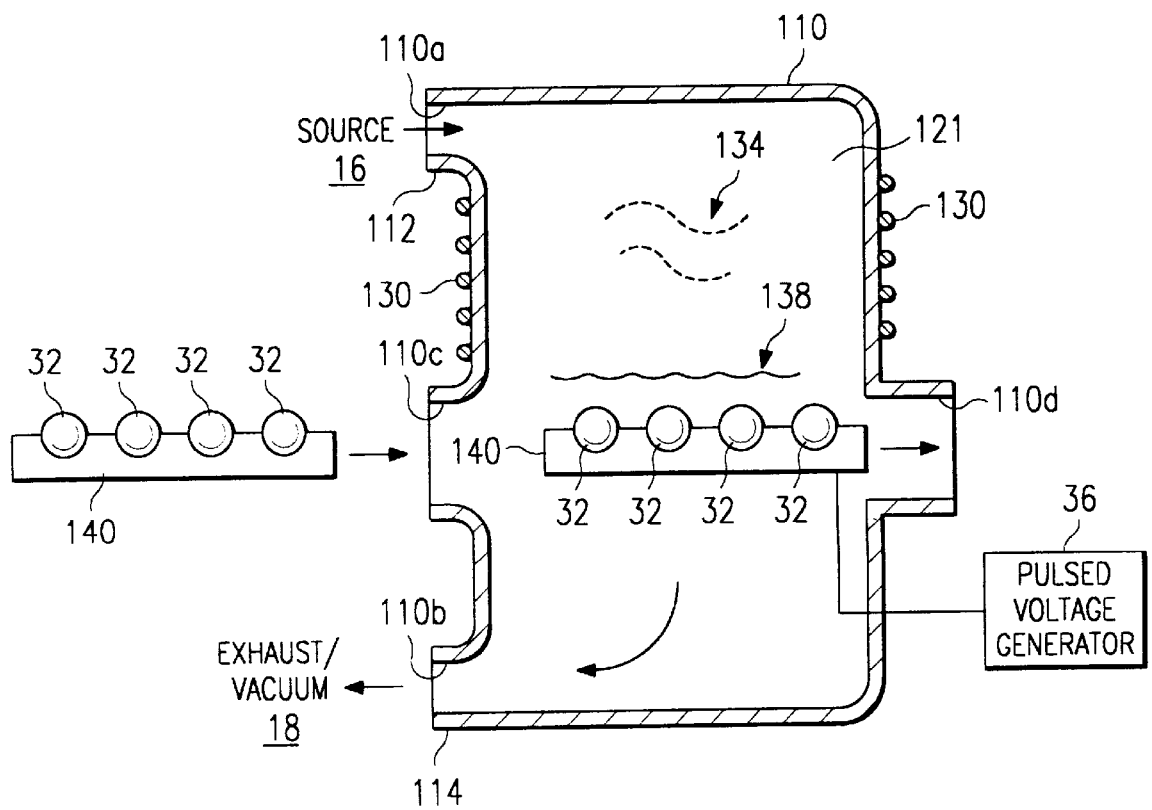
FIG. 3 illustrates a plasma processor according to another embodiment of the invention.

Referring to FIG. 3, in another embodiment, batch-type processing can also be realized. A processor 108 includes an enclosure 110 in the form of a hollow tube having an inlet opening 110a and an outlet opening 110b located diametrically opposite the inlet opening 110a. One end of a horizontally extending inlet conduit 112 registers with the inlet opening 110a for providing liquids and/or constituents to the tube 110 from the source 16. One end of a horizontally extending outlet conduit 114 registers with the outlet opening 110b for providing a negative pressure inside the tube 110 and exhausting materials to the vacuum/exhaust facility 18. It is understood that the conduits 112, 114 and tube 110 are connected in any known manner and, alternately, can be integrally formed.

An electrical conductor 130 is coiled around the outer surface of the tube 110 for creating a radio frequency signal in connection with a plasma process similar to that described in FIG. 1 to produce a plasma region 134.

A conveyor tray 140 holds a plurality of members 32 and is attached to the pulsed voltage source 36. The conveyor 140 also serves as an electrode to bias the members 32 and attract the positive ions out of a plasma 134. Because the surface of the members 32 serve as a equi-potential, the ions are attracted and implant the member surface uniformly, producing a uniform treatment zone including the high aspect trenches present on the silicon surface. After one batch is done, the conveyor tray 140 exits the tube 110 through outlet 110d and another batch is introduced through inlet 110c to receive the same treatment.

Referring to FIGS. 1–3, conventional materials can be used to construct the plasma processors 8, 108. The tubes 10, 12, 14, 110, 112, 114 can be made of quartz, the inductive coils 30, 130 of copper, and the inner tubes 19, 20 and tray 140 from stainless steel.

During ion implantation set-up, the plasma of the gas (e.g., $BF_3$ for boron implantation) is created by one of traditional ion sources. Then, the plasma is transported into the processing region and the pulsed ions are implanted to the member 32. Since semiconductor applications require low ion doses (e.g., $10^{12}14\ 10^{14}$ ions/cm$^2$), the implantation step can be accomplished extremely efficiently and quickly (by a series of pulses from the generator 36). In processor 8, any problem of the member 32 obtaining a charge, which may occur since the member is not grounded but is floating at the plasma potential, can be alleviated by secondary electrons indigenous to the plasma. Alternatively, the charge of the member 32 can be reduced with electron beams applied after the processing is accomplished.

The processors 8, 108 can be applied to form metal, oxide, nitride, amorphous and electrically doped layers for semiconductor applications. To deposit films (metallic interlayers, thermal barriers, oxides and so on) on the surface of member 32, the plasma source 16 provides appropriate constituents, such as metal ions. In general, all kinds of condensable plasma can be used, including metal compounds and alloys, semiconductors and others. Also, multiple kinds of metals can be applied to form alloys such as aluminum-copper. By adding certain gases into the plasma, the processors 8, 108 can produce oxide or nitride films. Also, deposition may occur as a result of recoil implantation of the previously deposited layers further down the surface. The pulsed voltage generator 36 may also vary the pulse time during which implantation occurs from the pulse time during which deposition occurs to modify the shape of the member's 32 profile.

If metal-organic compounds are introduced into the plasma carrier gas or the carrier gas is replaced by metal-organics, the plasma processors 8, 108 can be operated in a metal or metal oxide deposition mode. Also, by using low voltage ion pulses (e.g., <1 kV) and reactive ion gases (e.g., $SiCl_4$), the processors 8, 108 can achieve ion etching and trench etching. The etching is carried out by both chemical and physical sputtering.

The apparatuses and methods of the present invention lead to several advantages. For example, the continuous flow of the members 32 through the chamber 22 reduces or eliminates the need for batch processing. Also, the enclosures 10, 110 can be selectively maintained at a relatively high temperature at or above the warping or melting temperature of the members 32, by controlling the amount of inductively coupled plasma gas formed in the chambers. Further, the spherical shape of the members 32 provide much greater surface area on which the process gas acts, when compared to the surface area of a conventional flat semiconductor. Also, the method of the present invention can be carried out in a relatively small space and eliminates the requirements for large facilities. Still further, the chamber 22 can be used for many different processing steps depending on the type of processing gases that are introduced.

It is understood that several variations may be made in the foregoing. For example, the invention is not limited to the specific orientation of the various inlet and outlet conduits relative to the tube 10, 110 described above. Thus the members 32 and the gases can travel in a direction through the chamber 22 other than a vertical and horizontal direction, respectively, as described above. Also the direction of the flow of the plasma into the cylindrical passage 21 can extend at an angle other than ninety degrees relative to the direction of the passage of the members 32 through the chamber 22.

It is understood that other modifications, changes and substitutions are intended in the foregoing disclosure and in some instances some features of the invention will be employed without a corresponding use of other features. Accordingly, it is appropriate that the appended claims be construed broadly and in a manner consistent with the scope of the invention.

What is claimed is:

1. An apparatus for fabricating integrated circuits onto a semiconductor substrate, the apparatus comprising:

an enclosure defining a chamber;

first and second metallic portions concentric with the chamber, the first metallic portion surrounding the second metallic portion and including a plurality of apertures through which ions may flow;

a voltage generator electrically connected to the metallic portions;

a first inlet registering with the chamber for receiving a plurality of members of a semiconductor material;

a second inlet registering with the chamber for receiving at least one gas for treating the members; and a first outlet registering with the chamber for receiving and discharging the members from the chamber;

wherein the voltage generator supplies a pulsed voltage differential to the metallic portions, thereby attracting ions from the gas through the apertures of the first metallic portion and towards a center portion of the chamber.

2. The apparatus of claim 1 further comprising a second outlet registering with the chamber for receiving and discharging the gas from the chamber.

3. The apparatus of claim 2 further comprising a pressure device for altering the pressure inside the chamber.

4. The apparatus of claim 1 further comprising:

a plasma-producing system for generating a plasma region near the center portion of the chamber;

wherein the center portion of the chamber is surrounded by an inductively coupled plasma.

5. The apparatus of claim 4 wherein the gas forming the inductively coupled plasma is introduced through the second inlet.

6. The apparatus of claim 1 wherein the chamber is tubular in shape.

7. The apparatus of claim 2 wherein the first outlet is diametrically opposed to the first inlet and wherein the second outlet is diametrically opposed to the second inlet.

8. The apparatus of claim 7 further comprising a first inlet conduit registering with the first inlet for introducing the members to the first inlet, and a second inlet conduit registering with the second inlet for introducing the process gas to the second inlet.

9. An apparatus for fabricating semiconductor devices, the apparatus comprising:

an enclosure defining a chamber;

a conveyor tray on which at least one semiconductor device may rest without being physically connected;

a voltage generator electrically connected to the conveyor tray;

a first inlet registering with the chamber for receiving the conveyor tray and semiconductor device; and a second inlet registering with the chamber for receiving at least one gas for treating the semiconductor device;

wherein the voltage generator supplies a bias to the conveyor tray, thereby attracting ions from the gas towards the conveyor tray and thus towards the semiconductor device.

10. The apparatus of claim 9 wherein the voltage generator creates an equi-potential on the semiconductor device so that the ions are attracted and implant the semiconductor device uniformly.

11. The apparatus of claim 9 further comprising a second outlet registering with the chamber for receiving and discharging the gas from the chamber.

12. The apparatus of claim 11 further comprising a pressure device for altering the pressure inside the chamber.

13. The apparatus of claim 9 wherein the chamber also receives an inductively coupled plasma to raise the temperature in the chamber to a relatively high value.

14. The apparatus of claim 12 wherein the gas forming the inductively coupled plasma is introduced through the second inlet.

15. The apparatus of claim 9 wherein the chamber is tubular in shape.

16. The apparatus of claim 11 wherein the first outlet is diametrically opposed to the first inlet and wherein the second outlet is diametrically opposed to the second inlet.

17. The apparatus of claim 1 wherein the second metallic portion also includes a plurality of apertures through which ions may flow so that in response to the pulsed voltage differential, the ions from the gas also flow through the second metallic portion.

18. The apparatus of claim 17 wherein the first and second metallic portions are meshed.

19. The apparatus of claim 1 wherein the first metallic portion is coated with the same semiconductor as the substrate.

20. The apparatus of claim 9 wherein the semiconductor device can be lifted from the conveyor tray without requiring manual separation.

* * * * *